(12) United States Patent
Gaudiana et al.

(10) Patent No.: US 7,586,035 B2
(45) Date of Patent: Sep. 8, 2009

(54) PHOTOVOLTAIC CELL WITH SPACERS

(75) Inventors: Russell Gaudiana, Merrimack, NH (US); Alan Montello, West Newbury, MA (US); Edmund Montello, Rockport, MA (US)

(73) Assignee: Konarka Technologies, Inc., Lowell, MA (US)

( * ) Notice: Subject to any disclaimer, the term of this patent is extended or adjusted under 35 U.S.C. 154(b) by 537 days.

(21) Appl. No.: 11/033,217

(22) Filed: Jan. 10, 2005

(65) Prior Publication Data

US 2005/0189014 A1 Sep. 1, 2005

Related U.S. Application Data

(60) Provisional application No. 60/546,818, filed on Feb. 19, 2004.

(51) Int. Cl.
*H01L 31/00* (2006.01)
(52) U.S. Cl. .................. 136/263; 136/256; 136/252
(58) Field of Classification Search .......... 136/263, 136/245, 256, 252; 106/287.26; 516/88, 516/90
See application file for complete search history.

(56) References Cited

U.S. PATENT DOCUMENTS

| | | | | |
|---|---|---|---|---|
| 6,069,313 A | * | 5/2000 | Kay | 136/249 |
| 6,245,987 B1 | * | 6/2001 | Shiomi et al. | 136/244 |
| 6,291,763 B1 | * | 9/2001 | Nakamura | 136/256 |
| 6,316,786 B1 | * | 11/2001 | Mueller et al. | 257/40 |
| 6,580,026 B1 | * | 6/2003 | Koyanagi et al. | 136/263 |
| 6,657,119 B2 | * | 12/2003 | Lindquist et al. | 136/263 |
| 6,946,597 B2 | * | 9/2005 | Sager et al. | 136/263 |
| 2003/0056821 A1 | * | 3/2003 | Chittibabu et al. | 136/250 |
| 2003/0201010 A1 | | 10/2003 | Koyanagi et al. | |
| 2005/0067007 A1 | | 3/2005 | Toft | |

FOREIGN PATENT DOCUMENTS

| | | | |
|---|---|---|---|
| EP | 1 244 168 A1 | | 9/2002 |
| EP | 1 341 196 A2 | | 9/2003 |
| WO | WO01/03232 | * | 1/2001 |
| WO | WO 03/041177 | * | 3/2003 |
| WO | WO 03/041177 A1 | | 5/2003 |
| WO | WO 03/065472 A2 | | 8/2003 |

OTHER PUBLICATIONS

Chirvase et al.; Temperature dependent characteristics of poly(3-hexylthiophene)-fullerene based heterojunction organic solar cells, Journal of Applied Physics, vol. 93 #6, Mar. 2003, pp. 3376-3383.*
Saito et al., "Application of Poly(3,4-ethylenedioxythiophene) to Counter Electrode in Dye-Sensitized Solar Cells", Chemistry Letters 2002, pp. 1060-1061.*
Chevaleevski et al, "Alternative molecular semiconductors for sensitizing nanocrystalline solar cells" Conference Record of the 29th IEEE Photovoltaic Specialists Conference, vol. Conf. 29, May 19, 2002, pp. 1318-1321.
Shaheen S E et al.: "Low Band-Gap Polymeric Photovoltaic Devices" Synthetic Metals, Elsevier Sequoia, Lausanne, Ch, vol. 121, No. 1-3, Mar. 15, 2001, XP-001020483.

* cited by examiner

*Primary Examiner*—Nam X Nguyen
*Assistant Examiner*—Thanh-Truc Trinh
(74) *Attorney, Agent, or Firm*—Fish & Richardson P.C.

(57) ABSTRACT

Photovoltaic cells with spacers, as well as related compositions, systems, and methods, are disclosed.

49 Claims, 7 Drawing Sheets

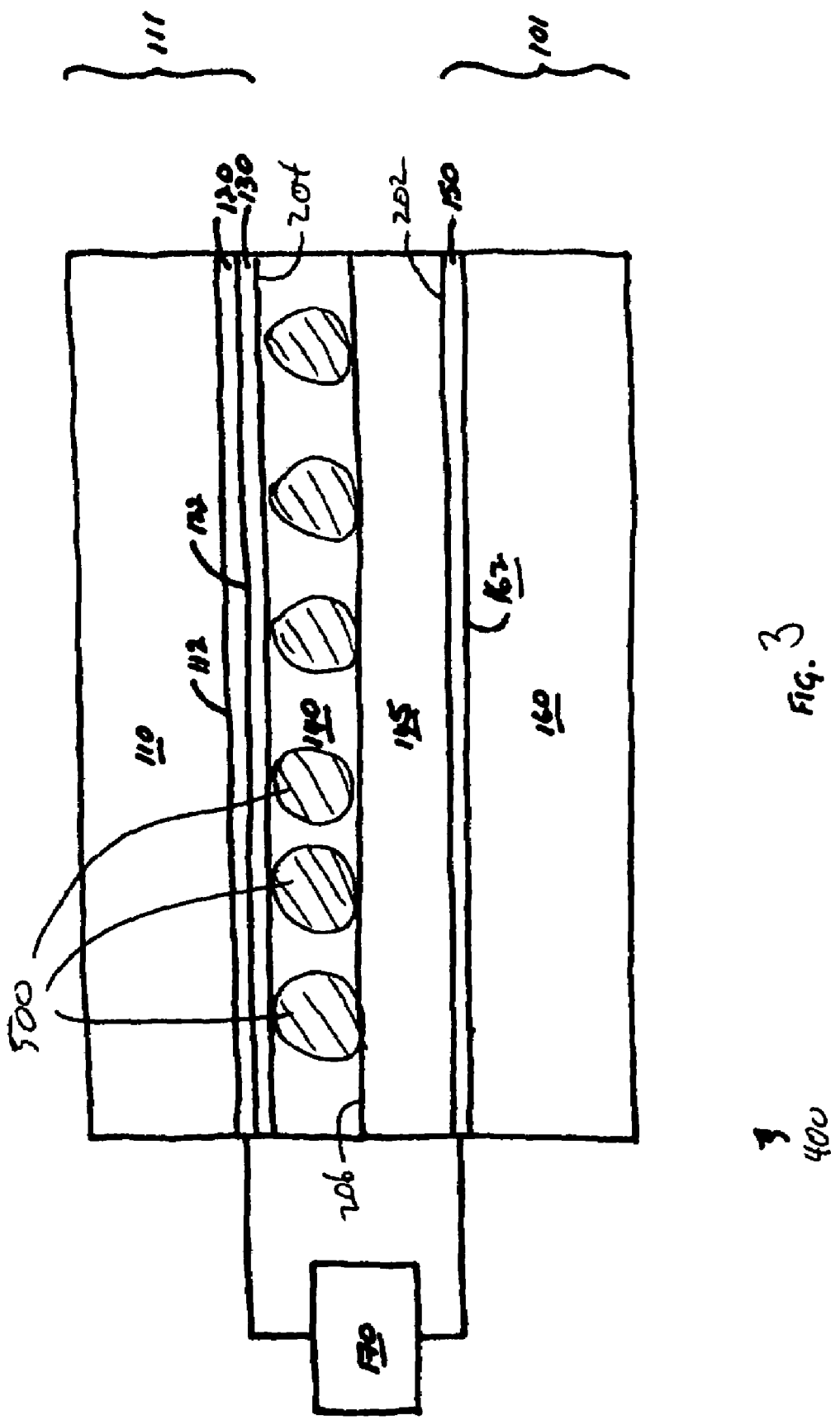

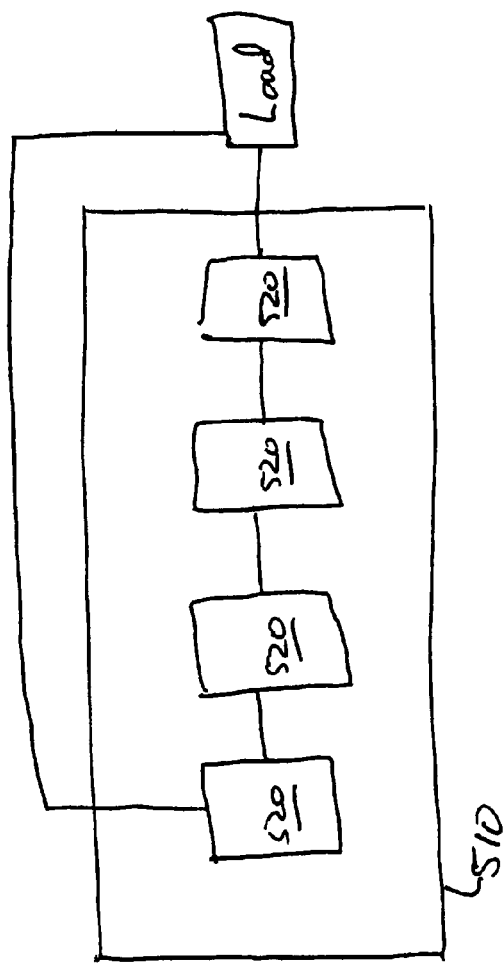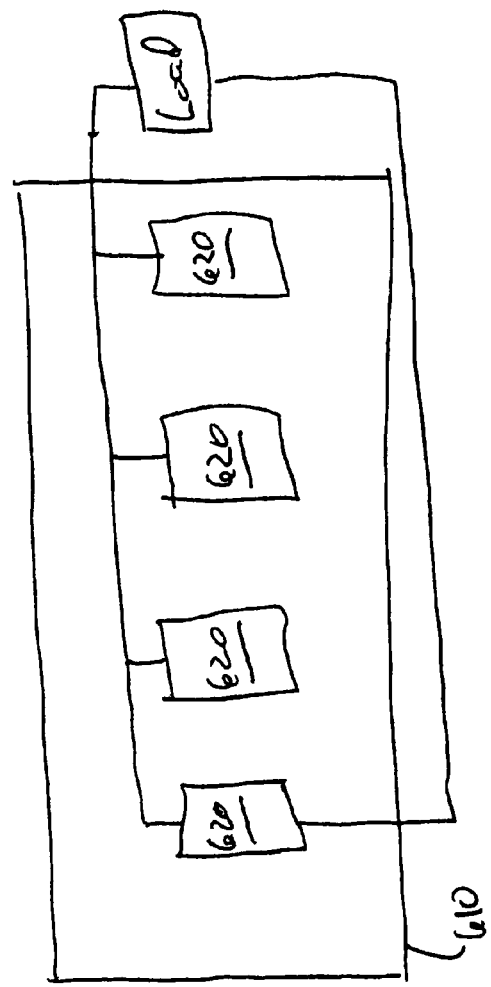

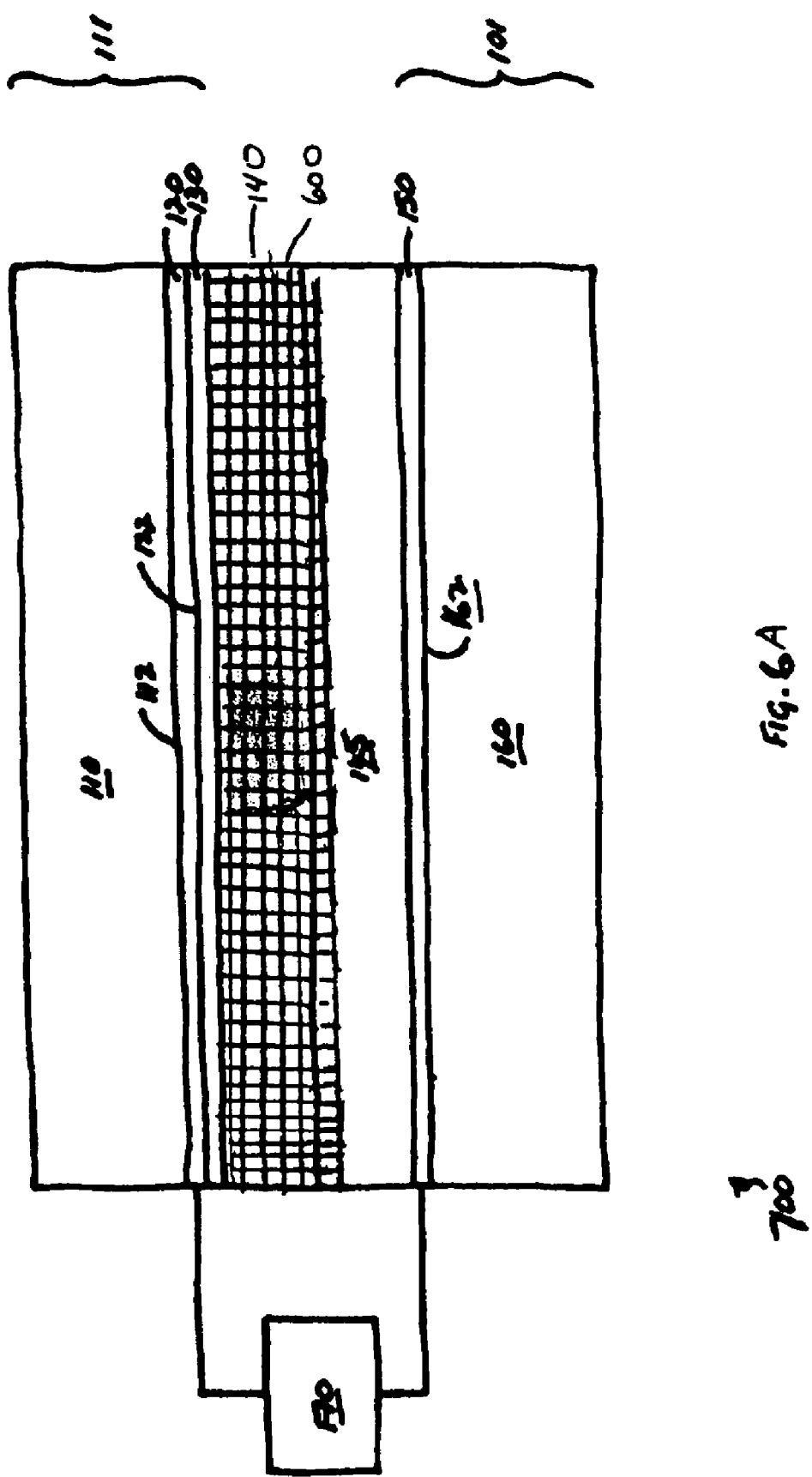

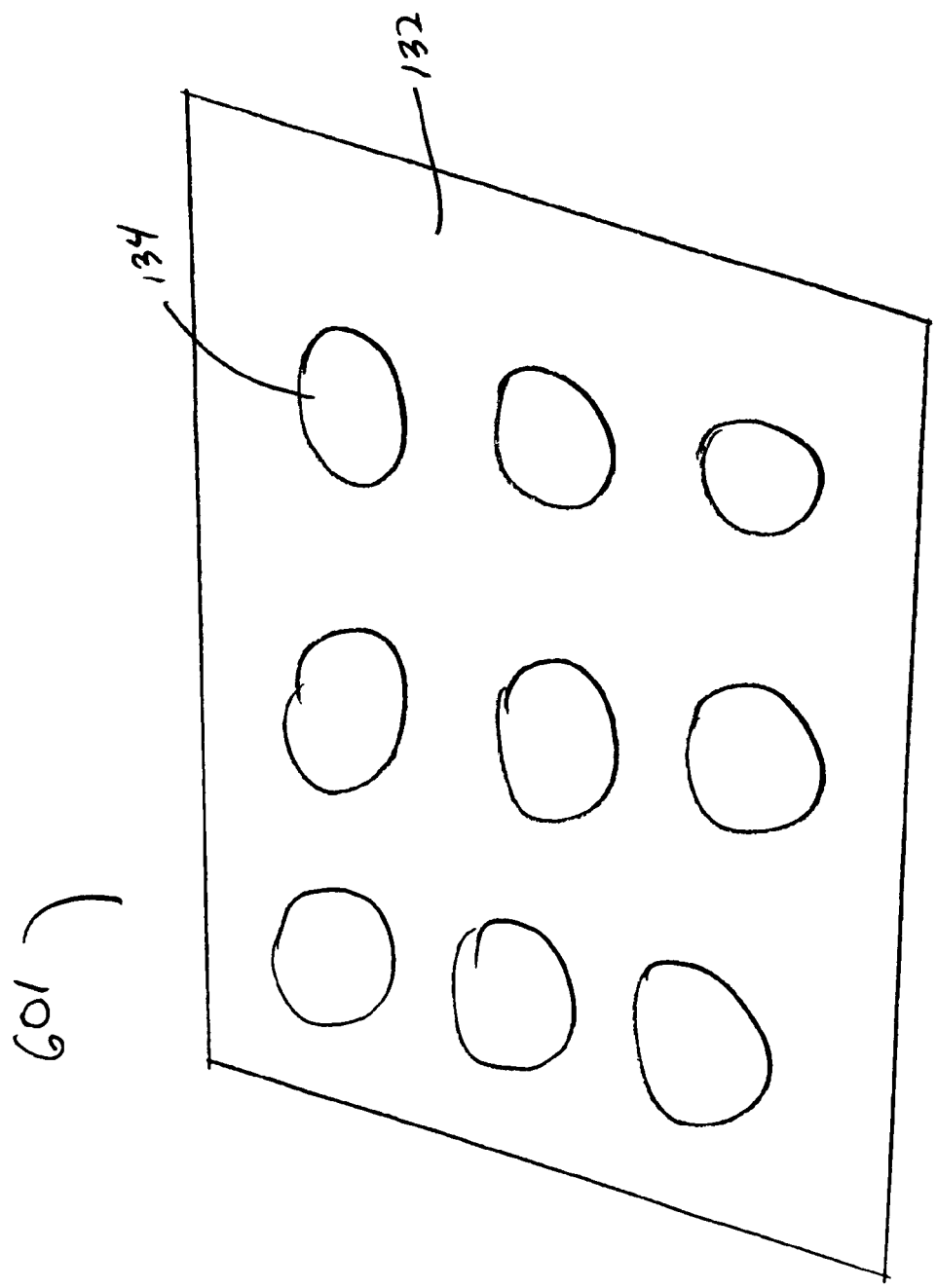

US 7,586,035 B2

PHOTOVOLTAIC CELL WITH SPACERS

CROSS-REFERENCE TO RELATED APPLICATION

This application claims priority under 35 U.S.C. §119(e) to U.S. Provisional Patent Application Ser. No. 60/546,818, filed Feb. 19, 2004, and entitled "Photovoltaic Cells With Spacers", the contents of which are hereby incorporated by reference.

TECHNICAL FIELD

The invention relates to photovoltaic cells with spacers, as well as related systems, and methods.

BACKGROUND

Photovoltaic cells are commonly used to convert energy in the form of light into energy in the form of electricity. Typically, a photovoltaic cell includes a photoactive material disposed between two electrodes.

One type of photovoltaic cell is a dye-sensitized solar cell (DSSC). Referring to FIG. 1, a DSSC 100 is shown, which includes a charge carrier layer 140 (e.g., including an electrolyte, such as an iodide/iodine solution) and a photoactive layer 145 (e.g., including a semiconductor material, such as $TiO_2$ particles) disposed between an electrode 101 and a counter electrode 111. Photoactive layer 145 also includes a photosensitizing agent, such as a dye. In general, the photosensitizing agent is capable of absorbing photons within a wavelength range of operation (e.g., within the solar spectrum). Electrode 101 includes a substrate 160 (e.g., a glass or polymer substrate) and an electrically conductive layer 150 (e.g., an ITO layer or tin oxide layer) disposed on an inner surface 162 of substrate 160. Counter electrode 111 includes a substrate 110, an electrically conductive layer 120 (e.g., ITO layer or tin oxide layer), and a catalyst layer (e.g., formed of platinum) 130, which catalyzes a redox reaction in charge carrier layer 140. Electrically conductive layer 120 is disposed on an inner surface 112 of substrate 110, while catalyst layer 130 is disposed on a surface 122 of electrically conductive layer 120. Electrode 101 and counter electrode 111 are connected by wires across an external electrical load 170.

During operation, in response to illumination by radiation in the solar spectrum, DSSC 100 undergoes cycles of excitation, oxidation, and reduction that produce a flow of electrons across load 170. Incident light excites photosensitizing agent molecules in photoactive layer 145. The photoexcited photosensitizing agent molecules then inject electrons into the conduction band of the semiconductor in layer 145, which leaves the photosensitizing agent molecules oxidized. The injected electrons flow through the semiconductor material, to electrically conductive layer 150, then to external load 170. After flowing through external load 170, the electrons flow to layer 120, then to layer 130, and subsequently to layer 140, where the electrons reduce the electrolyte material in charge carrier layer 140 at catalyst layer 130. The reduced electrolyte can then reduce the oxidized photosensitizing agent molecules back to their neutral state. The electrolyte in layer 140 can act as a redox mediator to control the flow of electrons from counter electrode 111 to working electrode 101. This cycle of excitation, oxidation, and reduction is repeated to provide continuous electrical energy to external load 170.

SUMMARY

The invention relates to photovoltaic cells with spacers, as well as related systems, and methods.

In one aspect, the invention features a photovoltaic cell that includes two electrodes, a photoactive material between the electrodes, and a plurality of spacers that are at least partially disposed in the photoactive material.

In another aspect, the invention features a photovoltaic cell that includes two electrodes, a photoactive material between the electrodes, and a plurality of spacers between the electrodes. The spacers are configured to prevent contact between the first electrode and the photoactive material when the photovoltaic cell is wrapped around a cylinder having a radius of about 1 inch or less.

In a further aspect, the invention features a photovoltaic cell that includes two electrodes, a photoactive material between the electrodes, and a plurality of electrically insulating spacers between the electrodes.

In an additional aspect, the invention features a photovoltaic cell that includes two electrodes, a charge carrier material between the electrodes, and a plurality of spacers that are at least partially disposed in the charge carrier material.

In yet another aspect, the invention features a photovoltaic cell that includes two electrodes, a photoactive material between the electrodes, and a member in the shape of a porous membrane or mesh that is at least partially disposed in the photoactive material. In one aspect, the invention features a system that includes a plurality of photovoltaic cells that are electrically connected (e.g., in series and/or in parallel). At least some of the photovoltaic cells include two electrodes, a photoactive material between the electrodes, and a plurality of spacers that are at least partially disposed in the photoactive material.

In another aspect, the invention features a system that includes a plurality of photovoltaic cells that are electrically connected (e.g., in series and/or in parallel). At least some of the photovoltaic cells include two electrodes, a photoactive material between the electrodes, and a plurality of spacers between the electrodes. The spacers are configured to prevent contact between the first electrode and the photoactive material when the photovoltaic cell is wrapped around a cylinder having a radius of about 1 inch or less.

In an additional aspect, the invention features a system that includes a plurality of photovoltaic cells that are electrically connected (e.g., in series, in parallel). At least some of the photovoltaic cells include two electrodes, a charge carrier material between the electrodes, and a plurality of spacers that are at least partially disposed in the charge carrier material.

In a further aspect, the invention features a system that includes a plurality of photovoltaic cells that are electrically connected (e.g., in series and/or in parallel). At least some of the photovoltaic cells include two electrodes, a photoactive material between the electrodes, and a plurality of electrically insulating spacers between the electrodes.

In still another aspect, the invention features a system that includes a plurality of photovoltaic cells that are electrically connected (e.g., in series and/or in parallel). At least some of photovoltaic cells include two electrodes, a photoactive material between the electrodes, and a member in the shape of a porous membrane or mesh that is at least partially disposed in the photoactive material.

Embodiments can include one or more of the following features.

The spacers can be configured to prevent contact between the first electrode and the photoactive material when the photovoltaic cell is wrapped around a cylinder having a radius of about 1 inch or less.

The spacers can be in a shape of selected from, for example, spheres, cones, cylinders, pyramids, cubes, rods, sheets, squares, circles, semicircles, triangles, diamonds, ellipses, trapezoids, irregular shapes and combinations thereof.

A porous membrane can be formed, for example, of Gortex™ or similar material.

The spacers can be in the shape of spheres having, for example, an average diameter of at least about one micrometer and/or an average diameter of at most about 50 micrometers.

The spacers can be formed of an electrically insulating material.

The spacers can be formed of, for example, resin or glass.

The spacers can be transparent or opaque.

The spacers can be in contact with one or both electrodes.

The spacers can include a crosslinking agent capable of linking the spacer to the photoactive material. For example, the photoactive material can include titania, and the crosslinking agent can be a titania crosslinking agent (e.g., $Ti(O-Alkyl)_4$ or a polymer thereof).

The photovoltaic cell can further include a charge carrier layer between the photoactive material and one of the electrodes. The spacers can be at least partially disposed in the charge carrier layer.

One or both of the electrodes can be a mesh electrode.

One or both of the electrodes can be formed of, for example, an electrically conductive material selected from copper, aluminum, indium, gold, palladium, titanium, platinum, stainless steel, indium tin oxide, tin oxide, fluorine-doped tin oxide and combinations thereof. Generally, at least one of the electrodes is formed of a material sufficiently transparent and/or porous to allow light entering the cell to pass through the electrode.

The photoactive material can be, for example, a photoactive nanoparticle material. Examples of photoactive nanoparticle materials include $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphide, potassium niobate, and combinations thereof. The photoactive nanoparticle material can further include a dye.

The photoactive layer can include an electron donor material and an electron acceptor material. Examples of electron acceptor materials include fullerenes (e.g., substituted fullerenes), inorganic nanoparticles, oxadiazoles, discotic liquid crystals, carbon nanorods, inorganic nanorods, polymers containing CN groups, polymers containing $CF_3$ groups and combinations thereof. Examples of electron donor materials include discotic liquid crystals, polythiophenes (e.g., poly(3-hexylthiophene), polyphenylenes, polyphenylvinylenes, polysilanes, polythienylvinylenes and polyisothianaphthalenes.

In some embodiments, the spacers are at least partially disposed in the charge carrier layer but not the photoactive layer.

In some embodiments, the spacers are at least partially disposed in both the charge carrier layer and the photoactive layer.

Embodiments can provide one or more of the following advantages.

In some embodiments, spacers can reduce the possibility of undesirable short circuiting of a photovoltaic cell. For example, the spacers can reduce the possibility of the counter electrode and photoactive material contacting each other. This can be particularly desirable, for example, when the photovoltaic cell is bent or flexed during use.

In certain embodiments, the spacers can maintain a distance (e.g., a substantially constant and/or substantially uniform distance) between electrodes of different charge (e.g., during operation and/or bending of a photovoltaic cell). This can, for example, reduce the likelihood that the counter electrode and photoactive material will contact each other.

The presence of the spacers can be particularly advantageous, for example, in cells in which there is a tendency for the spacing between the counter electrode and the photoactive material across a photovoltaic cell to be uneven. As an example, in certain photovoltaic cells, the liquid electrolyte has a relatively high surface tension. This can have a tendency to pull the counter electrode and photoactive material toward each other, which can result in undesirable contact (e.g., electrical shorting) between the electrodes, especially toward the center region of the cell. However, while it can be desirable to maintain spacing between the electrodes, it is also generally desirable to keep the spacing between the electrodes relatively small to enhance the efficiency of the cell in converting light to electricity.

In some embodiments, the photovoltaic cells can exhibit relatively long useful lifetimes.

In certain embodiments, the photovoltaic cells can exhibit relatively consistent performance over an extended period of time.

Features and advantages of the invention are in the description, drawings and claims.

DESCRIPTION OF DRAWINGS

FIG. 3 is a cross-sectional view of an embodiment of a photovoltaic cell;

FIG. 4 is a schematic of a system containing multiple photovoltaic cells electrically connected in series;

FIG. 5 is a schematic of a system containing multiple photovoltaic cells electrically connected in parallel;

FIG. 6A is a cross-sectional view of an embodiment of a photovoltaic cell;

FIG. 6C is an expanded view of a porous membrane.

Like reference symbols in the various drawings indicate like elements.

DETAILED DESCRIPTION

Figure 1:
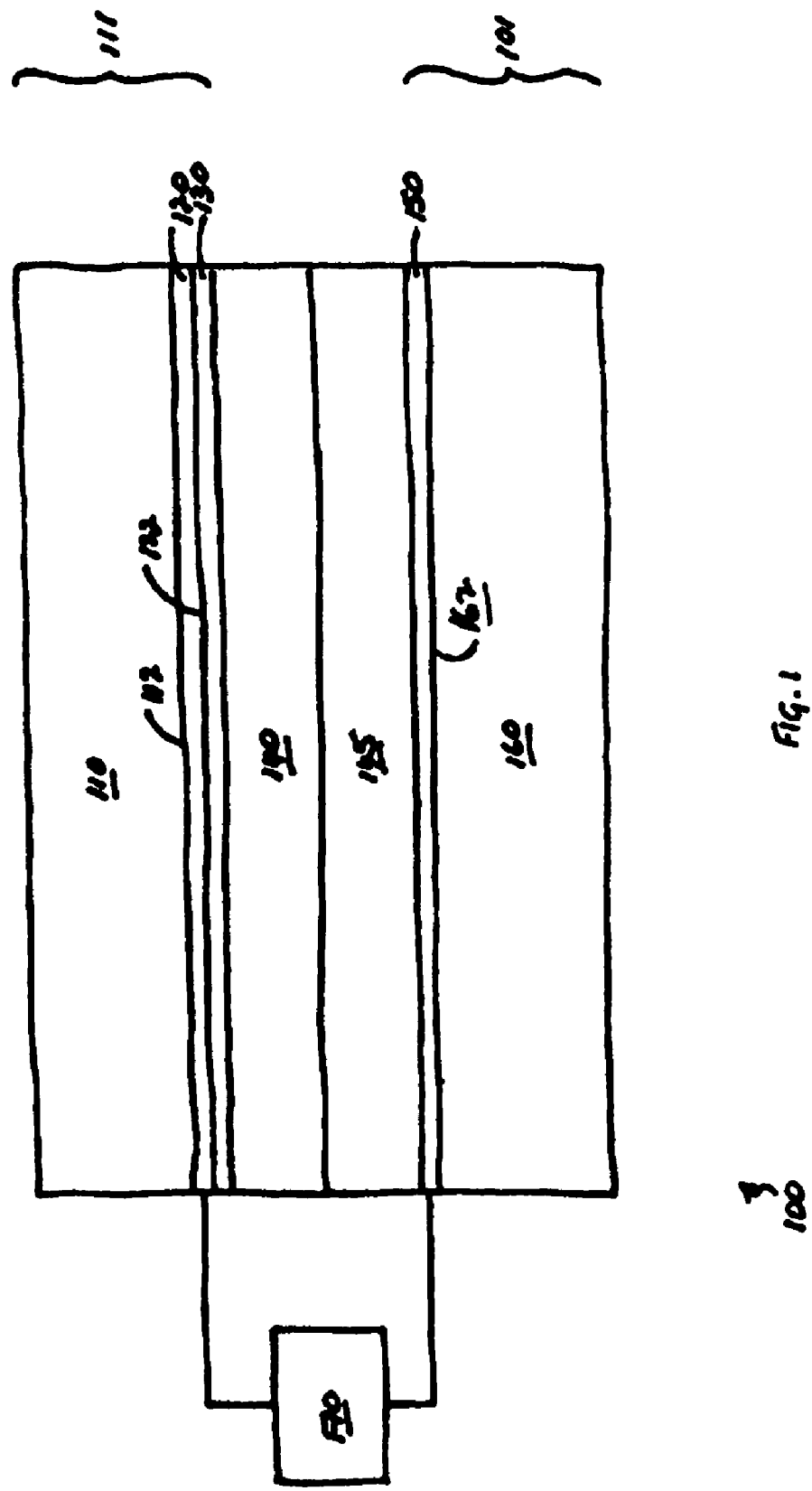
FIG. 1 is a cross-sectional view of an embodiment of a photovoltaic cell.
Figure 2:
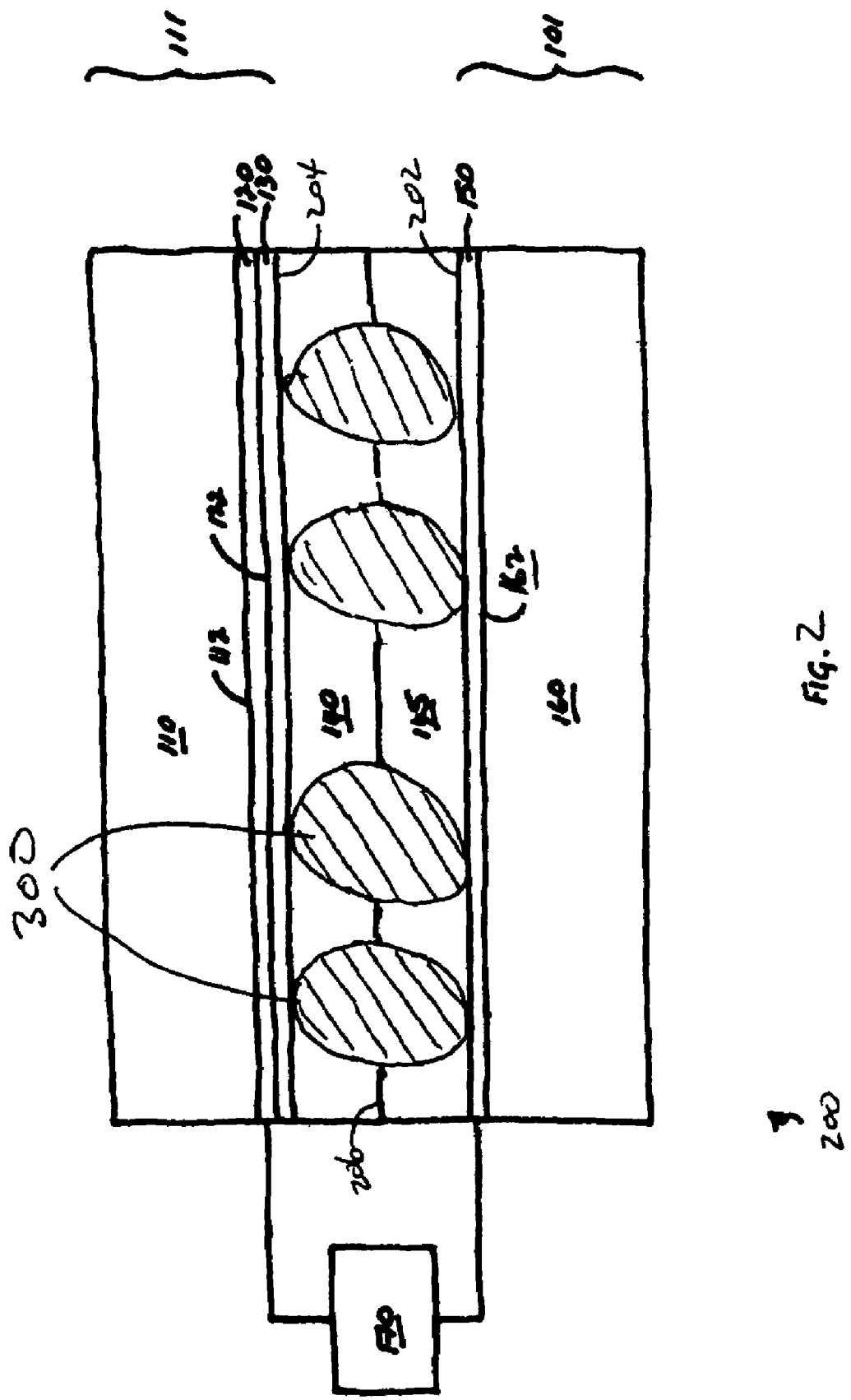
FIG. 2 is a cross-sectional view of an embodiment of a photovoltaic cell.

FIG. 2 shows a cross-sectional view of a photovoltaic cell 200 that includes electrically insulating spherical spacers 300. Spheres 300 are disposed in photoactive layer 145 and charge carrier layer 140 so that spheres 300 contact a surface 202 of electrically conductive layer 150 and a surface 204 of catalyst layer 130. With this arrangement, spacers 300 can maintain a distance between a surface 206 of photoactive layer 145 and a surface 204 of catalyst layer 130 so that, for example, when photovoltaic cell 200 is bent, photoactive layer 145 and counter electrode 111 do not contact each other. In some embodiments, spacers 300 are configured so that, when photovoltaic cell 300 is wrapped around a cylinder having a radius of about 1 inch or less (e.g., from about 0.1 inch to about 1 inch, from about 0.5 inch to about 1 inch, about one inch), photoactive layer 145 and counterelectrode 111 do not contact each other.

Typically, the size of spacers 300 is selected so that the distance between surfaces 206 and 204 is at least about 1 micron (e.g., at least about 2 microns, at least about 5 microns, at least about 8 microns, at least about 15 microns, at least about 20 microns) and/or at most about 40 microns (e.g., at most about 30 microns, at most about 25 microns, at most about 20 microns). For example, in some embodiments, the distance between surfaces 206 and 204 is from about 1 micron to about 20 microns (e.g., from about 5 microns to about 20 microns, from about eight microns to about 18 microns, from about eight microns to about 15 microns).

Thus, in embodiments in which spacers 300 are disposed within layers 145 and 140 (FIG. 2), spacers 300 can have an average diameter that is equal to the thickness of photoactive layer 145 plus at least about one micron (e.g., at least about 2 microns, at least about 5 microns, at least about 8 microns, at least about 15 microns, at least about 20 microns) and/or at most about 40 microns (e.g., at most about 30 microns, at most about 25 microns, at most about 20 microns). For example, in such embodiments, if photoactive layer is from about 10 microns to about 20 microns (e.g., from about 12 microns to about 15 microns) thick, then spacers 300 can have an average diameter of at least about 11 microns (e.g., at least about 12 microns, at least about 18 microns, at least about 20 microns) and/or at most about 60 microns (e.g., at most about 50 microns, at most about 40 microns, at most about 30 microns, at most about 25 microns).

FIG. 3 shows an alternate embodiment of a photovoltaic cell 400 in which spacers 500 are disposed in charge carrier layer 140 but not in photoactive layer 145 so that spacers 500 contact surfaces 204 and 206. In such embodiments, the average diameter of spacers 500 is about the same as the thickness of layer 140. In some embodiments, spacers 500 have an average diameter of at least about 1 micron (e.g., at least about 10 microns, at least about 15 microns, at least about 20 microns) and/or at most about 40 microns (e.g., at most about 35 microns, at most about 30 microns, at most about 25 microns).

Figure 6B:
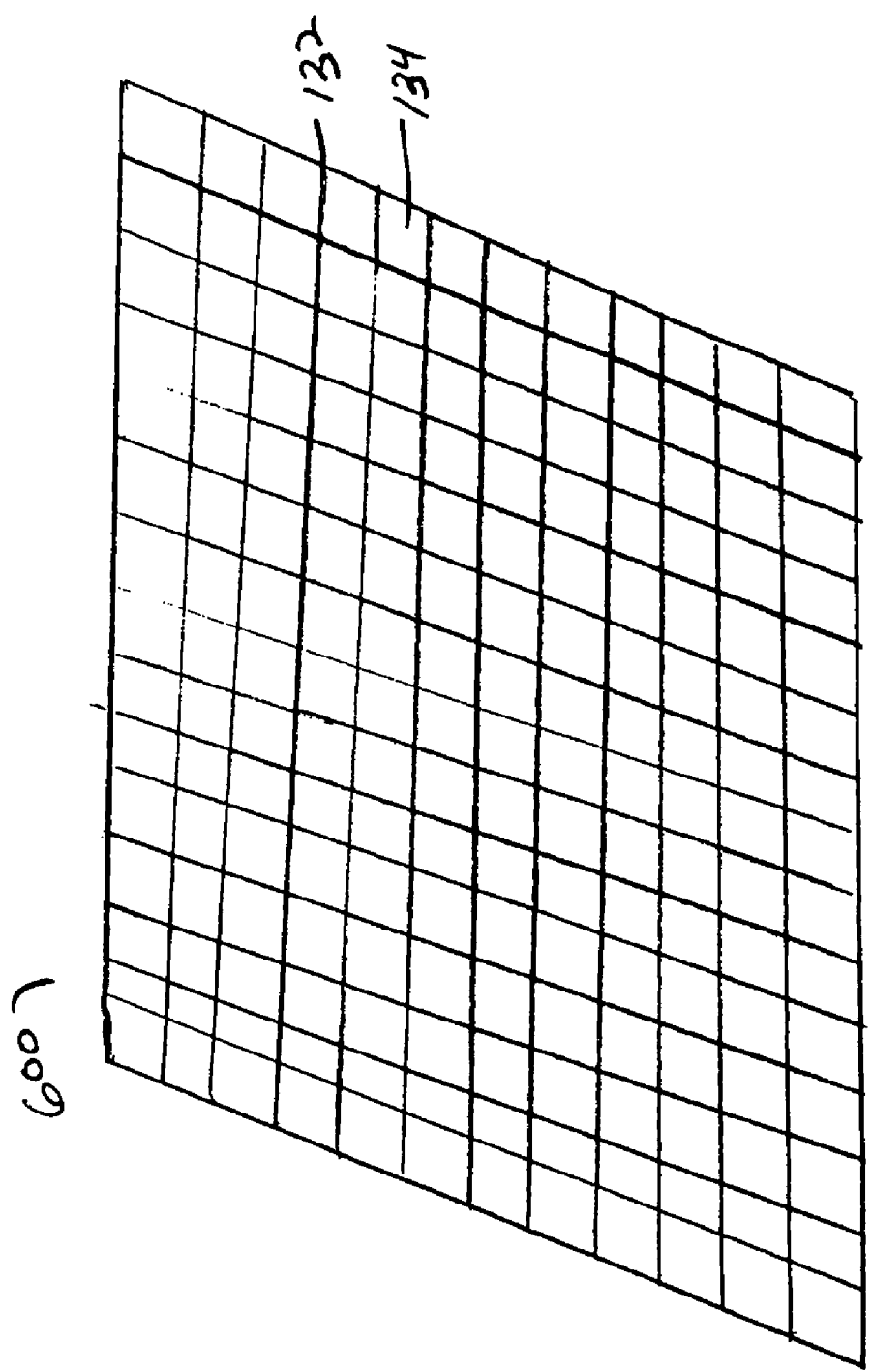
FIG. 6B is an expanded view of a mesh.

While embodiments have been described in which spacers are disposed in a photovoltaic cell, in certain embodiments, a mesh can be used instead of or in addition to the spacers. For example, FIG. 6A shows an embodiment of photovoltaic cell 700 containing a mesh 600 partially disposed in photoactive layer 145. FIG. 6B shows an expanded view of mesh 600.

Mesh 600 can be prepared in various ways. In some embodiments, mesh 600 is a woven mesh formed by weaving wires of material that form solid regions 132. The wires can be woven using, for example, a plain weave, a Dutch weave, a twill weave, a Dutch twill weave, or combinations thereof. In some embodiments, mesh 600 is an expanded mesh. An expanded mesh can be prepared, for example, by removing regions 134 (e.g., via laser removal, via chemical etching, via puncturing) from a sheet of material (e.g., an electrically insulating material), followed by stretching the sheet (e.g., stretching the sheet in two dimensions). In certain embodiments, mesh 600 is a sheet formed by removing regions 134 (e.g., via laser removal, via chemical etching, via puncturing) without subsequently stretching the sheet.

In certain embodiments, a porous membrane can be used instead of or in addition to spacers. FIG. 6C shows an expanded view of porous membrane 601. In such embodiments, the porous membrane is typically at least partially disposed in photoactive layer 145. Porous membrane 601 can be prepared in various ways. Porous membrane can be prepared, for example, from a sheet of material (e.g., an electrically insulating material, e.g., Gortex™), in which open regions 132 have been mechanically (e.g., via puncturing) and/or chemically formed.

Mesh 600 and porous membrane 601 include solid regions 132 and open regions 134. In general, regions 132 are formed of electrically insulating material so that mesh 600 and porous membrane 601 can allow light to pass therethrough via regions 134 and prevent electrical contact (and therefore shorting) between photoactive layer 145 and counter electrode 111.

The area of mesh 600 or porous membrane 601 occupied by open regions 134 (the open area of mesh 600 or porous membrane 601) can be selected as desired. Generally, the open area of mesh 600 or porous membrane 601 is at least about 10% (e.g., at least about 20%, at least about 30%, at least about 40%, at least about 50%, at least about 60%, at least about 70%, at least about 80%) and/or at most about 99% (e.g., at most about 95%, at most about 90%, at most about 85%) of the total area of mesh 600 or porous membrane 601.

In certain embodiments, solid regions 132 are formed entirely of an electrically insulating material (e.g., regions 132 are formed of a substantially homogeneous material that is electrically insulating). In some embodiments, combinations of electrically insulating materials are used.

While shown in FIGS. 6A and 6B as having a rectangular shape and in FIG. 6C as having a generally circular shape, open regions 134 can generally have any desired shape (e.g., square, circle, semicircle, triangle, diamond, ellipse, trapezoid, irregular shape). In some embodiments, different open regions 134 in mesh 600 and porous membrane 601 can have different shapes.

Solid regions 132 can generally have any desired shape (e.g., rectangle, circle, semicircle, triangle, diamond, ellipse, trapezoid, irregular shape). In some embodiments, different solid regions 132 in mesh 600 or porous membrane 601 can have different shapes.

In some embodiments, mesh 600 or porous membrane 601 is flexible (e.g., sufficiently flexible to be incorporated in photovoltaic cell 700 using a continuous, roll-to-roll manufacturing process). In certain embodiments, mesh 600 or porous membrane 601 is semi-rigid or inflexible. In some embodiments, different regions of mesh 600 or porous membrane 601 can be flexible, semi-rigid or inflexible (e.g., one or more regions flexible and one or more different regions semi-rigid, one or more regions flexible and one or more different regions inflexible). As noted above, spacers 300, mesh 600 or porous membrane 601 can be formed from an electrically insulating material. Typically, the material from which spacers 300, mesh 600 or porous membrane 601 are formed is also substantially inert to standard conditions of storage and use of the photovoltaic cell. Examples of materials from which the spacers can be formed include glass, polymers, resin, inorganic materials, organic materials, and combinations thereof.

Generally, spacers 300, mesh 600 or porous membrane 601 can be formed of an opaque material or a transparent material. Transparent refers to being able to transmit at least about 60% (e.g., at least about 70%, at least about 75%, at least about 80%, at least about 85%) of incident energy at a wavelength or a range of wavelengths used during operation of a photovoltaic cell. Opaque refers to being able to transmit less than about 10% of incident energy at a wavelength or a range of wavelengths used during operation of a photovoltaic cell.

Typically, the wavelength range of operation is within the solar spectrum (e.g., between about 380 nm and about 780 nm).

Typically, whether formed of an opaque material or transparent material, spacers 300, mesh 600 or porous membrane 601 are configured so that sufficient light can reach photoactive layer 145 to allow a photovoltaic cell to produce a desired amount of electricity. Thus, for example, in embodiments in which light reaches layer 145 via electrode 111, spacers 300, mesh 600 or porous membrane 601 can be transparent or spacers 300, mesh 600 or porous membrane 601 can be opaque so long as they are configured to allow sufficient light (e.g., at least about 60% of light that impinges on substrate 110, at least about 70%, at least about 80%, at least about 90%) to reach layer 145. Because spacers 300, mesh 600 or porous membrane 601 may reduce the ability of light to pass from electrode 111 to layer 145 when light reaches layer 145 via electrode 111, in embodiments in which spacers 300 are opaque, a relatively small number and/or small sized spacers may be used. In similar embodiments in which an opaque porous membrane 601 is used, a membrane having a large number of and/or large sized pores can be used. In other embodiments in which an opaque mesh 600 is used, a mesh having a large number of and/or large open regions can be used.

As another example, in certain embodiments, light can enter a photovoltaic cell via electrode 101. In such embodiments, spacers 300, mesh 600 or porous membrane 601 may have little or no effect on the ability of light to pass from electrode 101 to layer 145. Accordingly, in such embodiments, spacers 300 can be transparent or opaque and any desired number and/or size of spacers 300 may generally be used. In such embodiments, where porous membrane 601 or mesh 600 is used, the membrane or mesh can be transparent or opaque and can have any desired number of and/or sized pores or open regions.

Turning now to other components of the photovoltaic cell, catalyst layer 130 is generally formed of a material that can catalyze a redox reaction in charge carrier layer 140. Examples of materials from which layer 130 can be formed include platinum and poly(3,4-ethylenedioxythiophene) (PEDOT). PEDOT layers are discussed in U.S. Provisional Patent Application Ser. No. 60/495,302, filed on Aug. 15, 2003, which is hereby incorporated by reference.

The composition and thickness of electrically conductive layer 120 is generally selected based on desired electrical conductivity, optical properties, and/or mechanical properties of the layer. In some embodiments, layer 120 is transparent. Examples of transparent conductors suitable for forming such a layer include certain metal oxides, such as indium tin oxide (ITO), tin oxide, and a fluorine-doped tin oxide. Electrically conductive layer 120 may be, for example, between about 100 nm and 500 nm thick (e.g., between about 150 nm and 300 nm thick).

In embodiments where counter electrode 111 is not transparent, electrically conductive layer 120 can be opaque (can transmit less than about 10% of the visible spectrum energy incident thereon). For example, layer 120 can be formed from a continuous layer of an opaque metal, such as copper, aluminum, indium, or gold.

In some embodiments, electrically conductive layer 120 can include a discontinuous layer of a conductive material. For example, electrically conductive layer 120 can include an electrically conducting mesh. Suitable mesh materials include metals, such as palladium, titanium, platinum, stainless steels and alloys thereof. In some embodiments, the mesh material includes a metal wire. The electrically conductive mesh material can also include an electrically insulating material that has been coated with an electrically conducting material, such as a metal. The electrically insulating material can include a fiber, such as a textile fiber or optical fiber. Examples of fibers include synthetic polymeric fibers (e.g., nylons) and natural fibers (e.g., flax, cotton, wool, and silk). The mesh electrode can be flexible to facilitate, for example, formation of the DSSC by a continuous manufacturing process. The mesh electrode may take a wide variety of forms with respect to, for example, wire (or fiber) diameters and mesh densities (i.e., the number of wires (or fibers) per unit area of the mesh). The mesh can be, for example, regular or irregular, with any number of opening shapes. Mesh form factors (such as, e.g., wire diameter and mesh density) can be chosen, for example, based on the conductivity of the wire (or fibers) of the mesh, the desired optical transmissivity, flexibility, and/or mechanical strength. Typically, the mesh electrode includes a wire (or fiber) mesh with an average wire (or fiber) diameter in the range from about one micron to about 400 microns, and an average open area between wires (or fibers) in the range from about 60% to about 95%. Mesh electrodes are discussed in U.S. patent application Ser. No. 10/395,823, filed Mar. 24, 2003, and U.S. patent application Ser. No. 10/723,554, filed Nov. 26, 2003, both of which are hereby incorporated by reference. It is to be noted that, in embodiments where a mesh electrode is used and the spacers contact the surface of the mesh electrode, the size of the spacers should generally be selected so that the spacers do not fit within the open spaces of the mesh electrode. Thus, for example, in embodiments where a mesh electrode is used and the spacers contact the surface of the mesh electrode, rod-like and/or fiber-like spacers can be used.

Substrate 110 can be formed from a mechanically-flexible material, such as a flexible polymer, or a rigid material, such as a glass or thick polymer sheets. Examples of polymers that can be used to form a flexible substrate include polyethylene naphthalates (PEN), polyethylene terephthalates (PET), polyethylenes, polypropylenes, polyamides, polymethylmethacrylate, polycarbonate, and/or polyurethanes. Flexible substrates can facilitate continuous manufacturing processes such as web-based coating and lamination.

The thickness of substrate 110 can vary as desired. Typically, substrate thickness and type are selected to provide mechanical support sufficient for the DSSC to withstand the rigors of manufacturing, deployment, and use. Substrate 110 can have a thickness of from about 10 to about 5,000 microns, such as, for example, from about 100 to about 1,000 microns.

In embodiments where the counter electrode is transparent, substrate 110 is formed from a transparent material. For example, substrate 110 can be formed from a transparent glass or polymer, such as a silica-based glass or a polymer, such as those listed above. In such embodiments, electrically conductive layer 120 should also be transparent.

Substrate 160 and electrically conductive layer 150 can be similar to substrate 110 and electrically conductive layer 120, respectively. For example, substrate 160 can be formed from the same materials and can have the same thickness as substrate 110. In some embodiments however, it may be desirable for substrate 160 to be different from 110 in one or more aspects. For example, where the DSSC is manufactured using a process that places different stresses on the different substrates, it may be desirable for substrate 160 to be more or less mechanically robust than substrate 110. Accordingly, substrate 160 may be formed from a different material, or may have a different thickness that substrate 110. Furthermore, in embodiments where only one substrate is exposed to an illumination source during use, it is not necessary for both substrates and/or electrically conducting layers to be transparent. Accordingly, one of substrates and/or corresponding electrically conducting layer can be opaque.

Charge carrier layer 140 can include a material that facilitates the transfer of electrical charge from a ground potential or a current source to photoactive layer 145. General classes of suitable charge carrier materials include solvent-based liquid electrolytes, polyelectrolytes, polymeric electrolytes, solid electrolytes, n-type and p-type transporting materials (e.g., conducting polymers) and gel electrolytes. Other choices for charge carrier media are possible. For example, the charge carrier layer can include a lithium salt that has the formula LiX, where X is an iodide, bromide, chloride, perchlorate, thiocyanate, trifluoromethyl sulfonate, or hexafluorophosphate. As another example, the charge carrier layer can include an imidazolium derivative.

Charge carrier layer 140 typically includes a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are greater than or equal to one, where X is an anion, and M is lithium, copper, barium, zinc, nickel, a lanthanide, cobalt, calcium, aluminum, magnesium, or an organic cation such as imidazole. Suitable anions include chloride, perchlorate, thiocyanate, trifluoromethyl sulfonate, and hexafluorophosphate.

The charge carrier media can include a polymeric electrolyte. For example, the polymeric electrolyte can include poly (vinyl imidazolium halide) and lithium iodide and/or polyvinyl pyridinium salts. The charge carrier media can include a solid electrolyte, such as lithium iodide, pyridimum iodide, substituted imidazolium iodide, and/or a eutectic mixture of these and other salts, which are also known as ionic liquids.

The charge carrier media can include various types of polymeric polyelectrolytes. For example, suitable polyelectrolytes can include between about 5% and about 95% (e.g., 5-60%, 5-40%, or 5-20%) by weight of a polymer, e.g., an ion-conducting polymer, and about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide (PEO), polyacrylonitrile (PAN), polymethylmethacrylate (PMMA), polyethers, polyimides, and polyphenols. Examples of suitable plasticizers include ethyl carbonate, propylene carbonate, mixtures of carbonates, organic phosphates, butyrolactone, and dialkylphthalates.

In some embodiments, charger carrier layer 140 can include one or more zwitterionic compounds. Examples of such compounds are disclosed, for example, U.S. Provisional Patent Application Ser. No. 60/526,373, which is hereby incorporated by reference.

Photoactive layer 145 can include a semiconductor material and a photosensitizing agent. These component materials can be in the form of, for example, a photoactive nanoparticle material, a heterojunction composite material, or combinations thereof.

Examples of nanoparticles include nanoparticles of the formula $M_xO_y$, where M may be, for example, titanium, zirconium, tungsten, niobium, lanthanum, tantalum, terbium, or tin and x and y are integers greater than zero. Other suitable nanoparticle materials include fullerenes, nanotubes, sulfides, selenides, tellurides, and oxides of titanium, zirconium, tungsten, niobium, lanthanum, tantalum, terbium, tin, or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate may be suitable nanoparticle materials. In some embodiments, photoactive layer 145 includes nanoparticles with an average size between about 0.5 nm and about 100 nm (e.g., between about 2 nm and 80 nm, or between about 10 nm and 40 nm, such as about 20 nm).

The nanoparticles can be interconnected, for example, by high temperature sintering, or by a reactive polymeric linking agent, such as poly(n-butyl titanate). A polymeric linking agent can enable the fabrication of an interconnected nanoparticle layer at relatively low temperatures (e.g., less than about 300° C.) and, in some instances, at room temperature. The relatively low temperature interconnection process may be amenable to continuous manufacturing processes using polymer substrates. In embodiments in which photoactive layer 145 includes a cross-linking agent, the spacers, mesh, or membrane can include (e.g., be coated with) a material with a cross-linking agent, such as a titania cross-linking agent (e.g., Ti(O-alkyl)4 or a polymer thereof) which can link the spacers, mesh or membrane to the titania particles within photoactive layer 145 during sintering.

The interconnected nanoparticles are photosensitized by a photosensitizing agent. The photosensitizing agent facilitates conversion of incident light into electricity to produce the desired photovoltaic effect. It is believed that the photosensitizing agent absorbs incident light resulting in the excitation of electrons in the photosensitizing agent. The energy of the excited electrons is then transferred from the excitation levels of the photosensitizing agent into a conduction band of the interconnected nanoparticles. This electron transfer results in an effective separation of charge and the desired photovoltaic effect. Accordingly, the electrons in the conduction band of the interconnected nanoparticles are made available to drive an external load (e.g., load 170).

The photosensitizing agent can be sorbed (e.g., chemisorbed and/or physisorbed) on the nanoparticles. The photosensitizing agent may be sorbed on the surfaces of the nanoparticles, within the nanoparticles, or both. The photosensitizing agent is selected, for example, based on its ability to absorb photons in a wavelength range of operation (e.g., within the visible spectrum), its ability to produce free electrons (or electron holes) in a conduction band of the nanoparticles, and its effectiveness in complexing with or sorbing to the nanoparticles. Suitable photosensitizing agents may include, for example, dyes that include functional groups, such as carboxyl and/or hydroxyl groups, that can chelate to the nanoparticles, e.g., to Ti(IV) sites on a $TiO_2$ surface. Exemplary dyes include anthocyanines, porphyrins, phthalocyanines, merocyanines, cyanines, squarates, eosins, and metal-containing dyes such as cis-bis(isothiocyanato)bis (2,2'-bipyridyl-4,4'-25 dicarboxylato)-ruthenium (II) ("N3 dye"), tris(isothiocyanato)-ruthenium (II)-2,2':6',2"-terpyridene-4,4',4"-tricarboxylic acid, cis-bis(isothiocyanato)bis (2,2'-bipyridyl-4,4'-dicarboxylato) ruthenium (II) bis-tetrabutylammonium, cis-bis(isocyanato) (2,2'-bipyridyl-4,4' dicarboxylato) ruthenium (II) and tris(2,2'-bipyridyl-4,4'-dicarboxylato) ruthenium (II) dichloride, all of which are available from Solaronix.

Examples of electron acceptor materials that can be used in a heterojunction composite include fullerenes, oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups). In some embodiments, the electron acceptor material is a substituted fullerene (e.g., PCBM). In some embodiments, a combination of electron acceptor materials can be used.

Examples of electron donor materials that can be used in a heterojunction composite material include discotic liquid crystals, polythiophenes, polyphenylenes, polyphenylvinylenes, polysilanes, polythienylvinylenes, and polyisothianaphthalenes. In some embodiments, the electron donor material is poly(3-hexylthiophene). In certain embodiments, a combination of electron donor materials can be used.

Multiple photovoltaic cells can be electrically connected to form a photovoltaic system. As an example, FIG. 4 is a schematic of a photovoltaic system 500 having a module 510 containing photovoltaic cells 520. Cells 520 are electrically connected in series, and system 500 is electrically connected to a load. As another example, FIG. 5 is a schematic of a photovoltaic system 600 having a module 610 that contains photovoltaic cells 620. Cells 620 are electrically connected in parallel, and system 600 is electrically connected to a load. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

While certain embodiments have been disclosed, others are also possible.

As an example, while shown above as being of substantially uniform size, in some embodiments, the spacers in a photovoltaic cell can have varying sizes. In certain embodiments, when two or more spacers are used, each spacer can have a unique size and/or shape.

As another example, while shown above as being substantially uniformly distributed in a photovoltaic cell, in certain embodiments, the spacers can be non-uniformly distributed in a photovoltaic cell.

As a further example, although described above as being spherical, spacers can generally be of any desired shape. Examples of shapes include cones, cylinders, pyramids, boxes, rods, sheets, squares, circles, semicircles, triangles, diamonds, ellipses, trapezoids, and irregular shapes. In some embodiments, combinations of shapes can be used.

As an additional example, in some embodiments in which the spacers are disposed in charge carrier layer 140 and photoactive layer 145, the spacers are not in contact with surface 202 and/or surface 204. For example, the spacers may be disposed in layers 140 and 145 such that the spacers are in contact with surface 202 but not surface 204, the spacers may be disposed in layers 140 and 145 such that the spacers are in contact with surface 204 but not surface 202, or the spacers may be disposed in layers 140 and 145 such that the spacers are not in contact with surface 204 or 202.

As a further example, in some embodiments in which the spacers are disposed in charge carrier layer 140 but not in photoactive layer 140, the spacers are not in contact with surface 204 and/or 206. For example, the spacers may be disposed in layer 140 but not in layer 145 such that the spacers are in contact with surface 204 but not surface 206, the spacers may be disposed in layer 140 but not in layer 145 such that the spacers are in contact with surface 206 but not surface 204, or the spacers may be disposed in layer 140 but not in layer 145 such that the spacers are not in contact with surface 206 or 204.

As another example, in certain embodiments in which the spacers are disposed in charge carrier layer 140 without also being disposed in photoactive layer 145, the spacers are not in contact with surface 204 and/or surface 206.

As a further example, in certain embodiments in which the spacers are disposed in photoactive layer 145 without also being disposed in charge carrier layer 140, the spacers are not in contact with surface 202 and/or surface 206.

As an additional example, in some embodiments, a spacer can itself be an electrically insulating mesh or grid. If the spacer is a mesh or grid, it may be preassembled, extruded and laminated, printed (e.g., inkjet or gravure), or sprayed onto the appropriate surface(s). Alternatively, such a spacer can be disposed entirely within charge carrier layer 140, i.e., with no portion of the spacer being in contact with surfaces 206 or 204.

As another example, although the materials in charge carrier layer 140 are described above as being in a layer distinct from the materials in photoactive layer 145, in some embodiments, one or more materials of layer 140 can be at least partially disposed (intermixed with) the materials in photoactive layer 145 (e.g., to optimize contact between the two layers). For example, if photoactive layer 145 is porous, certain components of charge carrier layer 140 can be disposed within the pores of photoactive layer 145.

As another example, a protective layer can be applied to one or both of the substrates. A protective layer can be used to, for example, keep contaminants (e.g., dirt, water, oxygen, chemicals) out of a photovoltaic cell and/or to ruggedize the cell. A protective layer can be formed of a polymer (e.g., a fluorinated polymer).

Further, while certain types of photovoltaic cells with spacers have been described, spacers can also be used in other types of cells. Examples include photoactive cells with an active material formed of amorphous silicon, cadmium selenide, cadmium telluride, copper indium sulfide, and copper indium gallium arsenide.

As an additional example, while embodiments have been described in which a mesh or porous membrane are partially disposed in the photoactive layer, in certain embodiments, a mesh or porous membrane can be entirely disposed within the photoactive layer.

The photovoltaic cells can generally be used as a component in any intended system. Examples of such systems include roofing, package labeling, battery chargers, sensors, window shades and blinds, awnings, opaque or semitransparent windows, and exterior wall panels.

Other embodiments are in the claims.

What is claimed is:

1. A photovoltaic cell, comprising:
   a first electrically conductive layer;
   a second electrically conductive layer;
   a photoactive material between the first and second electrically conductive layers; and
   a plurality of spacers between the photoactive material and the first electrically conductive layer,
   wherein the spacers comprise a crossliniking agent for linking the spacers to the photoactive material, the spacers are not disposed in the photoactive material, the spacers are not in contact with the first electrically conductive layer, and the spacers are not in contact with the second electrically conductive layer.

2. The photovoltaic cell of claim 1, wherein the spacers are configured to prevent contact between the first electrically conductive layer and the photoactive material when the photovoltaic cell is wrapped around a cylinder having a radius of about 1 inch or less.

3. The photovoltaic cell of claim 1, wherein the photoactive material comprises titania, and the crosslinking agent is a titania crosslinking agent.

4. The photovoltaic cell of claim 3, wherein the crosslinking agent is Ti(O-Alkyl)$_4$ or a polymer thereof.

5. The photovoltaic cell of claim 1, further comprising a charge carrier layer between the photoactive material and the second electrically conductive layer.

6. The photovoltaic cell of claim 5, wherein the spacers are disposed in the charge carrier layer.

7. The photovoltaic cell of claim 1, wherein the first electrically conductive layer is a mesh electrode.

8. The photovoltaic cell of claim 7, wherein the second electrically conductive layer is a mesh electrode.

9. The photovoltaic cell of claim 1, wherein at least one of the first and second electrically conductive layers comprises an electrically conductive material selected from the group consisting of copper, aluminum, indium, gold, palladium, titanium, platinum, stainless steel, indium tin oxide, tin oxide, fluorine-doped tin oxide and combinations thereof.

10. The photovoltaic cell of claim 1, wherein the photoactive material comprises a photoactive nanoparticle material.

11. The photovoltaic cell of claim 10, wherein the photoactive nanoparticle material comprises a material selected from the group consisting of $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium suiphide, potassium niobate, and combinations thereof.

12. The photovoltaic cell of claim 10, wherein the photoactive nanoparticle material further comprises a dye.

13. The photovoltaic cell of claim 1, wherein the photoactive material comprises an electron donor material and an electron acceptor material.

14. The photovoltaic cell of claim 13, wherein the electron acceptor material comprises a material selected from the group consisting of fullerenes, organic nanoparticles, inorganic nanoparticles, oxadiazoles, polyoxadiazols, discotic liquid crystals, carbon nanorods, carbon nanotubes, inorganic nanorods, polymers containing CN groups, polymers containing $CF_3$ groups and combinations thereof.

15. The photovoltaic cell of claim 13, wherein the electron acceptor material comprises a substituted fullerene.

16. The photovoltaic cell of claim 13, wherein the electron donor material comprises a material selected from the group consisting of discotic liquid crystals, polythiophenes, polyphenylenes, polyphenylvinylenes, polysilanes, polythienylvinylenes and polyisothianaphthalenes.

17. The photovoltaic cell of claim 13, wherein the electron donor material comprises poly(3-hexylthiophene).

18. The photovoltaic cell of claim 17, wherein the electron acceptor material comprises a substituted fullerene.

19. A photovoltaic system comprising a plurality of photovoltaic cells of claim 1.

20. The photovoltaic system of claim 19, wherein at least some of the plurality of photovoltaic cells are electrically connected.

21. The photovoltaic system of claim 20, wherein at least some of the electrically connected photovoltaic cells are electrically connected in parallel.

22. The photovoltaic system of claim 20, wherein at least some of the electrically connected photovoltaic cells are electrically connected in series.

23. The photovoltaic system of claim 20, wherein at least some of the electrically connected photovoltaic cells are electrically connected to a load.

24. The photovoltaic system of claim 19, wherein all of the plurality of photovoltaic cells are electrically connected.

25. The photovoltaic system of claim 24, wherein the photovoltaic cells are electrically connected in parallel.

26. The photovoltaic system of claim 24, wherein the photovoltaic cells are electrically connected in series.

27. The photovoltaic system of claim 24, wherein the photovoltaic cells are electrically connected to a load.

28. The photovoltaic system of claim 19, wherein the photovoltaic cells are electrically connected to a load.

29. The photovoltaic cell of claim 1, wherein the photoactive material comprises a polymer.

30. The photoactive cell of claim 1, wherein the photoactive material comprises a fullerene.

31. The photovoltaic cell of claim 1, wherein the spacers are in a shape selected from the group consisting of spheres, cones, cylinders, pyramids, cubes, rods, sheets, squares, circles, semicircles, triangles, diamonds, ellipses, trapezoids, and combinations thereof.

32. The photovoltaic cell of claim 1, wherein the spacers are in the shape of spheres.

33. The photovoltaic cell of claim 32, wherein the spheres have an average diameter of at least about one micrometer.

34. The photovoltaic cell of claim 33, wherein the spheres have an average diameter of at most about 50 micrometers.

35. The photovoltaic cell of claim 1, wherein the spacers comprise an electrically insulating material.

36. The photovoltaic cell of claim 1, wherein the spacers comprise resin or glass.

37. The photovoltaic cell of claim 1, wherein the spacers are transparent.

38. The photovoltaic cell of claim 1, wherein the spacers are opaque.

39. A photovoltaic cell, comprising:
a first electrically conductive layer;
a second electrically conductive layer;
a photoactive material between the first and second electrically conductive layers;
a charge carrier material between the photoactive material and the first electrically conductive layer, the charge carrier material comprising an electrolye; and
a mesh between the first and second electrically conductive layers,
wherein the mesh comprises a crosslinking agent for linking the mesh to the photoactive material, the mesh is at least partially disposed in the photoactive material and at least partially disposed in the charge carrier material, the mesh is not in contact with the first electrically conductive layer, and the mesh is not in contact with the second electrically conductive layer.

40. The photovoltaic cell of claim 39, wherein the mesh comprises a plurality of solid regions and open regions.

41. The photovoltaic cell of claim 40, wherein the open regions are at least about 10% of the total area of the mesh.

42. The photovoltaic cell of claim 40, wherein the open regions are at most about 99% of the total area of the mesh.

43. The photovoltaic cell of claim 40, wherein the solid regions comprise an electrically insulating material.

44. The photovoltaic cell of claim 40, wherein the open regions are in a shape selected from the group consisting of square, circle, semicircle, triangle, diamond, ellipse, trapezoid, and.

45. The photovoltaic cell of claim 40, wherein the solid regions are in a shape selected from the group consisting of rectangle, circle, semicircle, triangle, diamond, ellipse, trapezoid, and.

46. The photovoltaic cell of claim 40, wherein different solid regions have different shapes.

47. The photovoltaic cell of claim 40, wherein different open regions have different shapes.

48. The photovoltaic cell of claim 39, wherein the mesh transmits at least about 60% of the incident light.

49. A photovoltaic cell, comprising:
a first electrically conductive layer;
a second electrically conductive layer;
a photoactive material between the first and second electrically conductive layers;
a plurality of spacers between the photoactive material and the first electrically conductive layer; and
a catalyst layer between the spacers and the first electrically conductive layer, the catalyst layer comprising poly(3,4-ethylenedioxythiophene),
wherein the spacers comprise a crosslinking agent for linking the spacers to the photoactive material, the spacers are not disposed in the photoactive material, the spacers are not in contact with the first electrically conductive layer, and the spacers are not in contact with the second electrically conductive layer.

* * * * *

UNITED STATES PATENT AND TRADEMARK OFFICE
CERTIFICATE OF CORRECTION

PATENT NO. : 7,586,035 B2  
APPLICATION NO. : 11/033217  
DATED : September 8, 2009  
INVENTOR(S) : Russell Gaudiana Page 1 of 1

It is certified that error appears in the above-identified patent and that said Letters Patent is hereby corrected as shown below:

Column 12
Line 60, replace "crossliniking" with --crosslinking--

Column 13
Line 31, replace "suiphide," with --sulphide,--

Column 13
Line 41, replace "polyoxadiazols," with --polyoxadiazoles,--

Column 14
Line 45, replace "electrolye;" with --electrolyte;--

Column 14
Line 66-67, replace "trapezoid, and." with --and trapezoid.--

Column 15
Line 3-4, replace "trapezoid, and." with --and trapezoid.--

Signed and Sealed this

Third Day of November, 2009

David J. Kappos
*Director of the United States Patent and Trademark Office*